United States Patent [19]

Baccini

[11] Patent Number: 5,314,711
[45] Date of Patent: May 24, 1994

[54] METHOD AND APPARATUS FOR PRINTING GREEN-TAPE FOIL CIRCUITS

[76] Inventor: Gisulfo Baccini, Via Duca d'Aosta 1, Mignagola di Carbonera (TV), Italy

[21] Appl. No.: 931,314

[22] Filed: Aug. 18, 1992

[30] Foreign Application Priority Data

Sep. 30, 1991 [IT] Italy .................... UD91A000155

[51] Int. Cl.⁵ .................... B05D 5/12; B05C 3/20
[52] U.S. Cl. .................... 427/97; 427/96; 427/282; 427/294; 118/50; 118/406; 118/681; 118/687
[58] Field of Search ............ 427/96, 97, 282, 294; 118/406, 413, 46, 50, 680, 681, 687

[56] References Cited

U.S. PATENT DOCUMENTS

| | | | |
|---|---|---|---|
| 3,638,564 | 2/1972 | Prange et al. | 101/35 |
| 4,307,661 | 12/1981 | Wilkins et al. | 101/93.01 |
| 4,362,486 | 12/1982 | Davis et al. | 425/126.1 |
| 4,695,482 | 9/1987 | Weiswurm | 118/680 |
| 4,845,839 | 7/1989 | Brown | 29/620 |
| 4,947,787 | 8/1990 | Grah et al. | 118/322 |
| 4,949,665 | 8/1990 | Weber | 118/322 |
| 5,079,193 | 1/1992 | Donohue . | |
| 5,080,929 | 1/1992 | Zachman et al. | 427/97 |
| 5,113,788 | 5/1992 | Izumi et al. | 427/97 |

FOREIGN PATENT DOCUMENTS 2-310996 12/1990 Japan .................... 427/96
2209521 5/1989 United Kingdom .

Primary Examiner—Terry J. Owens
Attorney, Agent, or Firm—Nixon & Vanderhye

[57] ABSTRACT

A method and apparatus for processing green-tape type circuits, whereby through contacts and electrical circuits are obtained on a thin foil of alumina in the raw state or another analogous or like material containing reference holes or marks (29) and connecting microholes (30) by means of a printing process with a conductive material, the green-tape foils being able to arrive from a wound roll of basic material or from a stock of already cut foils, in which method a green-tape foil (10) complete with through connecting holes (30) and reference holes or marks (29) is positioned on a conveyor belt (12) comprising at lest specific zones of transpirable material (3) and loaded with the green-tape foil (10), which is identified as a position in relation to the belt (12), is then printed after reciprocal positioning with a printing means, is dried and discharged, the apparatus comprising at least one loading station (13), a station (15) to identify the position of the green-tape foil (10), a printing station (18) and a drying station (19), these stations being able to be individual single stations or to be combined in two or more stations.

9 Claims, 2 Drawing Sheets

METHOD AND APPARATUS FOR PRINTING GREEN-TAPE FOIL CIRCUITS

BACKGROUND OF THE INVENTION

1. Field of the Invention

This invention a method to process hybrid circuits according to the so-called green-tape technology and also a device that employs the method, as set forth in the respective main claims.

The method according to the invention can also be employed for the processing of solar cells, printed circuits and anything else which can be used with the same system.

2. Discussion of Prior Art

The hybrid circuits of the so-called green-tape technology consist of very thin foils of alumina in the raw state or another analogous or like material, the foils having a circuit printed on one or both of their two faces.

The green-tape foils are superimposed on each other in a coordinated manner in a number which may even amount to various tens of foils, and the foils are then compressed so as to be bonded to each other and to produce a multi-layer element of a slender thickness.

The various components forming the green-tape circuit and included on the individual foils are possibly set in communication with each other by means of suitable holes made in the foils and filled with a conductive material.

The green-tape foils of the present technology are conveyed on supports, of paper for instance, to the various processes.

Paper supports are used advantageously to facilitate separation of the green-tape foils, since during the filling of the connecting micro-holes with the conductive material, that conductive material may emerge and become spread on and/or adhere to the support.

Lastly, the green-tape foils are dried, assembled in a pre-set number and compressed so as to obtain a multi-layer electrical circuit.

The operations of engaging, positioning and inserting the green-tape foils are carried out by hand and involve considerable times and costs as well as a great number of rejects owing to the lack of accuracy in the filling and printing operations (by screen process printing, for instance) and to the damage caused by manual handling.

SUMMARY OF THE INVENTION

The present applicant has studied, tested and obtained this invention so as to be able to provide an automatic or semi-automatic working cycle and to achieve further advantages.

This invention is set forth and characterized in the relative main claims, while the dependent claims describe variants of the idea of the main solution.

The invention consists in providing a method which enables hybrid circuits to be processed according to the so-called green-tape technology and consists also in providing a device suitable to carry out the method.

To be more exact, the method according to the invention makes possible the operations of taking the green-tape foil, possibly overturning the foil, identifying the exact position of the same, filling the connecting holes, printing the circuit and drying and discharging the green-tape foils.

The method of this invention is characterized in that the green-tape foils are conveyed in the relative processing stations by one single conveyor belt.

The conveyor belt is driven by actuation means, winding/unwinding rollers capable of intermittent motion, for instance.

This conveyor belt is started at a suitable moment and moved for the necessary time to transfer the green-tape foil from one station to another station, so that the movement takes place step by-step in a controlled manner.

At least part of the conveyor belt is made of a transpirable material.

In other words, the conveyor belt comprises zones which are regularly spaced apart and include immovable, or replaceable, transpirable material. If the transpirable material is replaceable, the conveyor belt cooperates with a replacement station.

According to a variant the conveyor belt includes a continuous support able to let the air pass through the support; on this support is deposited at least momentarily a strip of transpirable material.

The conveyor belt is conformed so as to be able to cooperate with negative pressure means positioned below itself.

The transpirable material consists, for instance, of transpirable paper of the type used for cigarettes or another analogous material or of a material which performs the same purpose.

In this case the conveyor belt can be removed and replaced.

According to a variant the transpirable material consists of a steel mesh with very thin weft elements of the type used for screen process printing or another analogous material or a material performing the same purpose. In this case the conveyor belt can consist of an endless belt, and at least two rollers will be included which determine the travel of the belt and are driven in such a way as to enable the conveyor belt to be advanced step-by-step in a controlled manner.

In the above case of an endless belt a station is included for the cleaning of the conveyor belt.

The cleaning station may include washing means, drying means and possibly brush and aspiration means.

The belt of a transpirable material prevents the passage of substances, such as the paste of conductive material, which are employed to fill the connecting micro-holes in the green-tape foil.

Meanwhile, the belt of a transpirable material does not hinder the passage through itself of the action of negative pressure exerted at the various processing stations or continuously by suitable aspiration means positioned below the belt. The action of negative pressure can thus act on the green-tape foil.

The green-tape foil is firmly held in this way on the conveyor belt by the negative pressure thus created and stays in a substantially constant position in relation to the conveyor belt.

The method according to this invention enables the green-tape foil to be handled in a semi-automatic or automatic manner without machine operators but with great accuracy and with an excellent finished result in very short cycle times.

The method according to the invention includes a first step of loading the green-tape foils arriving, for instance, from a container or another means suitable for the purpose.

The green-tape foils may also come directly from a continuous strip of basic material from which the green-tape foils are sheared beforehand, the delivery of the foils being carried out by suitable engagement and delivery means.

The green-tape foils include connecting micro-holes and positioning and/or reference holes or marks.

The loading step consists in positioning each green-tape foil individually on the conveyor belt in a correct manner.

According to a variant the green-tape foil is then conveyed to an overturning station where it is overturned if it has to be printed on its rear, or on its rear as well as on its front side.

Thereafter the conveyor belt conveys the green-tape foils deposited on itself in a continuous sequence to a position identification station, where the exact positions of the green-tape foils and therefore of the reference holes contained in the foils are identified in relation to the conveyor belt.

The position identification station may coincide with the loading station or with another subsequent station.

This identification, which may be carried out with one or more telecameras for instance, identifies accurately the positions of two or more reference marks or holes on the green-tape foil and locates those positions in relation to the conveyor belt.

Next, the green-tape foil is brought to a station in which there takes place the filling of the connecting micro-holes in the green-tape foil by means of a paste of conductive material.

In this station the printing assembly is checked in relation to the parameters obtained in the position identification station, so that the green-tape foil and the printing assembly, which may be of a screen process printing type, are reciprocally aligned.

Then the conveyor belt positions the green-tape foil within a drying oven.

According to a further variant the above overturning station is located downstream of the drying oven.

According to another variant, after the drying step the conveyor belt conveys the green-tape foil to a second position identification station.

Thereafter the green-tape foil is brought to a circuit printing station, after which the conveyor belt conveys the green-tape foil into a second drying oven.

Lastly, the method according to the invention includes a station for discharge and delivery of the green-tape foil thus produced.

BRIEF DESCRIPTION OF THE DRAWINGS

The attached drawings are given as a non-restrictive example and show some preferred lay-outs of the invention as follows.

DETAILED DISCUSSION OF PREFERRED EMBODIMENTS

Figure 1:
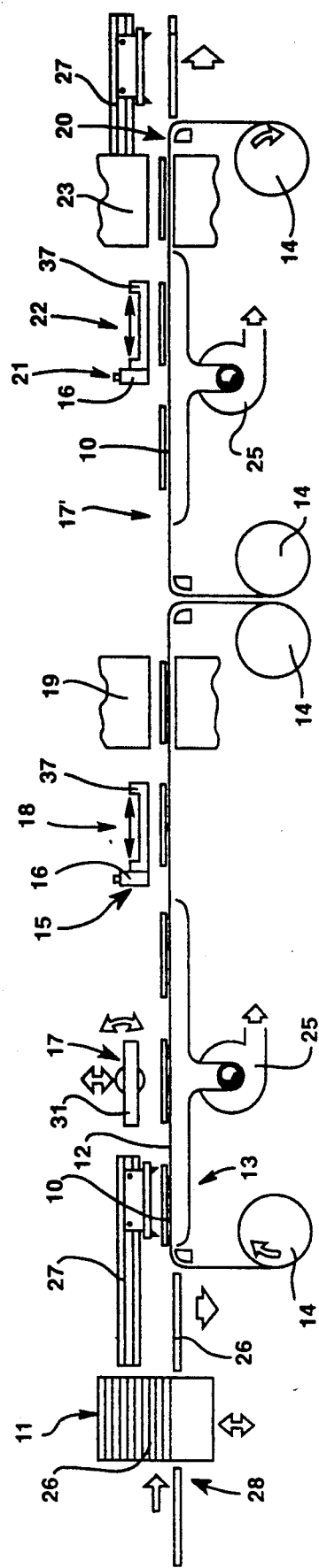
FIG. 1 is a diagram of a method to process green-tape type circuits according to the invention.

In this case green-tape foils 10 are taken one by one from a suitable container 11 holding suitable stacked supports on successive vertically developing planes, on which the green-tape foils 10 are positioned; the green-tape foils 10 are taken by engagement and delivery means 27 after their support 26 has been withdrawn from the container 11 by expulsion means 28.

These green-tape foils 10 are of standard dimensions and are positioned on their specific support 26 and already include connecting micro-holes 30 for the circuit to be printed, and reference holes and/or marks 29.

After being removed from their support 26, the green-tape foils 10 are positioned in a continuous sequence on a conveyor belt 12 in a loading station 13 by the engagement and delivery means 27.

The conveyor belt 12 has a development on one single plane advantageously.

According to a variant the conveyor belt 12 has a development on a plurality of planes or with intermediate vertical diversions.

According to a further variant more than one conveyor belt 12 may be included side by side on the same plane along the processing line so as to obviate an excessive length of the conveyor belt 12.

The conveyor belt 12 is driven by actuation means, which in this case are winding/unwinding rollers 14 capable of an intermittent motion actuated in a controlled manner for the necessary time; this motion enables the conveyor belt 12 to be advanced step-by-step in a controlled manner.

The conveyor belt 12 consists of a transpirable material 32, such as transpirable paper or the like, so as to hinder the passage of substances, such as a paste of conductive material, employed to fill the connecting micro-holes 30 in the green-tape foil 10.

Meanwhile, the action of a negative pressure exerted in the various processing stations by suitable aspiration means 25, shown diagrammatically here and in any event unimportant for the purposes of the invention, is not prevented from passing through the conveyor belt 12 by the transpirable material 32.

The aspiration means 25 can work along the whole of the conveyor belt 12, on part of the same as shown in the figure or in each single station.

Owing to the negative pressure the green-tape foil 10 is held firmly on the conveyor belt 12 by negative pressure exerted by the aspiration means 25 and thus stays in a constant position in relation to the conveyor belt 12.

The conveyor belt 12 conveys the green-tape foil 10 from the loading station 13 to an overturning station 17, where the green-tape foil 10 is overturned if its rear has to be printed.

Engagement means 31 are included in the overturning station 17 and take the green-tape foil 10 from, and deliver it again on to, the conveyor belt 12 and cooperate with inverting means, which are not shown here.

Thereafter the conveyor belt 12 conveys the green-tape foil 10 to a position identification station 15, in which the exact position of the green-tape foil 10 and therefore of any holes therein is identified.

This identification, which may be performed by one or more telecameras 16, detects precisely the positions of two or more reference marks or holes 29 on the green-tape foil 10 and positions them correctly with reference to the conveyor belt 12.

The telecameras 16 are firmly secured to a screen process printing headstock 37 included in a filling station 18. When the telecameras 16 have identified the correct position of the green-tape foil 10, the screen process printing headstock 37 is displaced and positioned above the green-tape foil 10 to perform the screen process printing.

In the filling station 18 the connecting micro-holes 30 of the green-tape foil 10 are filled with a paste of conductive material.

Then the conveyor belt 12 positions the green-tape foil 10 in an oven 19 to dry the filling material.

According to a variant the above overturning station 17 is located downstream of the drying oven 19 in the position 17'.

Thereafter, the conveyor belt 12 conveys the green-tape foil 10 to a second position identification station 21 substantially analogous to the station 15, and the foil 10 is brought thence to a circuit printing station 22, where the required circuit is printed on the foil 10 with reference to the connecting micro-holes 30.

Lastly, the conveyor belt 12 conveys the green-tape foil 10 into a second drying oven 23 to dry the circuit printed on the foil 10.

The method according to the invention includes a station 20 for discharge and delivery of the green-tape foils 10 thus produced.

Engagement and delivery means 27 or other means suitable for the purpose may be comprised in the discharge and delivery station 20.

In the example of FIG. 1 the conveyor belt 12, consists of transpirable paper, for instance of the type used for cigarettes, wound in a roll on winding/unwinding rollers 14. When the roll of transpirable paper has been finished, it is replaced by a new roll of transpirable paper.

According to a variant the other side of the same paper is used, and the paper is then replaced.

Figure 2:
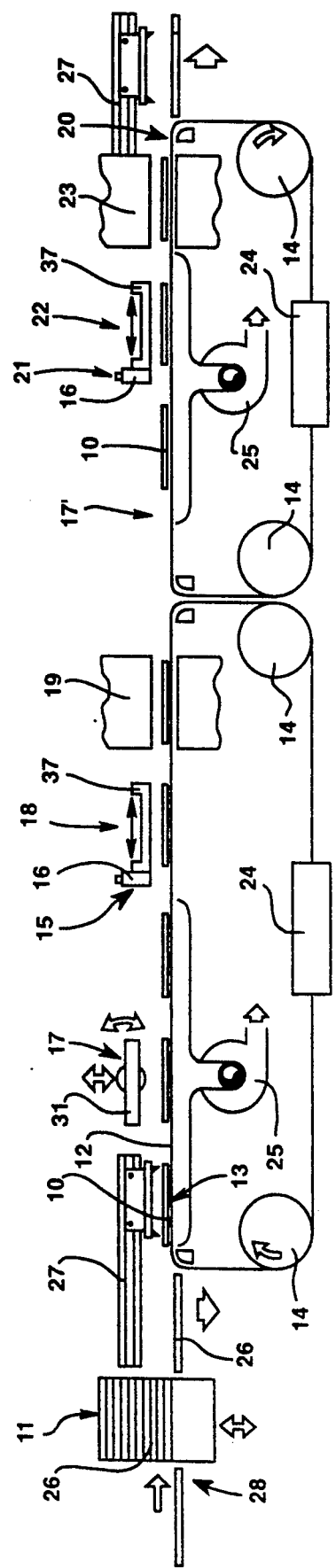
FIG. 2 shows a variant of FIG. 1.

FIG. 2 shows a variant employed where the transpirable material 32 of the conveyor belt 12 consists of a steel mesh with very thin weft elements (screens of the type used for screen process printing) or another analogous material or a material performing the same purpose.

In this case the conveyor belt 12 is an endless belt driven by suitable rollers 14 so actuated as to enable the conveyor belt 12 to advance with a controlled step-by-step motion.

According to the variant of FIG. 2 a station 24 to clean the conveyor belt 12 is included and makes possible the removal of the paste of conductive material, or other material, deposited on the conveyor belt 12. This cleaning station 24 may comprise advantageously ultrasonic cleaning systems or other systems suitable for the purpose. It may also include means to perform washing, drying, aspiration of dusts, etc.

Figure 3:
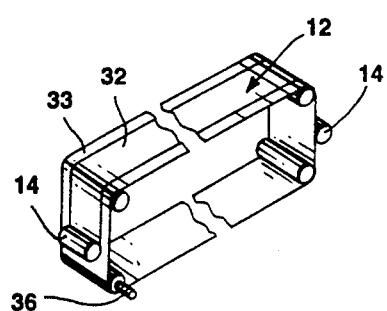
FIG. 3 shows a further variant of the embodiment of FIG. 1.

FIG. 3 shows a conveyor belt 12 consisting of a supporting belt 33, on which the transpirable material 32 is deposited and kept in position and moved together with the supporting belt 33 by negative pressure means 25. This transpirable material 32 is in the form of a roll and can be removed and replaced.

Figure 4:
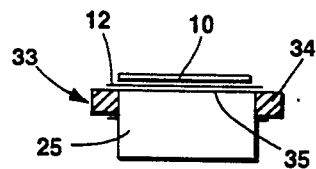
FIG. 4 shows a detail of the embodiment of FIG. 3.
Figure 5:
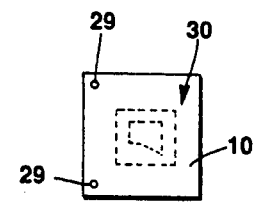
FIG. 5 shows a possible green-tape foil.

In the example of FIG. 4 the supporting belt 33 includes an intermediate perforated layer 35 and lateral retaining edges 34 with the function of lateral stiffening and retention of the lengthwise size.

In the example of FIG. 3 a drive motor 36 drives the supporting belt 33 step by step.

According to a variant of FIG. 3 the intermediate perforated layer 35 consists of a mesh for screen process printing and cooperates with the cleaning station 24.

I claim:

1. Method of printing green-tape foil circuits, whereby through contacts and electrical circuits are obtained on a green-tape foil of alumina containing reference holes or marks and connecting micro-holes by means of a printing process with a conductive material, the green-tape foils arriving from a wound roll of foil or from a stock of already cut foils, the method comprising the steps of:

placing a green-tape foil complete with through connecting holes and reference holes or marks on a conveyor belt said conveyor belt including at least specific zones of transpirable material, said foils located upon said transpirable material;

identifying a position of said green-tape foil in relation to the belt;

adjusting a printing means in response to said identified position of said foil on said belt and printing said green tape foil with said printing means, and drying and discharging said printed green-tape foil.

2. Method as in claim 1, further including the step of replacing and renewing the transpirable material.

3. Method as in claim 1, further including the step of cleaning the transpirable material substantially continuously.

4. Method as in claim 3, in which the transpirable material is a screen printing mesh.

5. Device for processing green-tape foil circuits, in which through contacts and electrical circuits are obtained on a green-tape foil of alumina containing reference holes or marks and connecting micro-holes by means of a printing process with a conductive material, the green-tape foil arriving directly from a wound roll of foil or from a stock of already cut foils, the device comprising:

a conveyor belt, said belt comprising at least specific zones of transpirable material and cooperating with at least one loading station, means for placing said green-tape foil on said transpirable material, station means for identifying the position of the green-tape foil, a printing station responsive to said position of said green-tape foil on said belt for printing said conductive material at a specified location on said green-tape foil; and a drying station for drying said printed material on said green-tape foil.

6. Device as in claim 5, wherein the transpirable material (32) consists of transpirable paper wound in a replaceable roll.

7. Device as in claim 5, wherein the transpirable material consists of an endless washable screen process printing mesh.

8. Device as in claim 7, further including a half cleaning station.

9. Device as in claim 5, wherein said conveyor belt includes a means for creating a negative pressure in the at least specific zones of said transpirable material, said transpirable material and said creating means comprising a means for holding said green-tape foil flat on said belt.

* * * * *